United States Patent [19]

Shiobara et al.

[11] Patent Number: 5,235,005
[45] Date of Patent: Aug. 10, 1993

[54] POLYIMIDE RESIN COMPOSITION AND SEMICONDUCTOR DEVICE ENCAPSULATED THEREWITH

[75] Inventors: Toshio Shiobara; Koji Futatsumori; Shinichi Jingu, all of Annaka, Japan

[73] Assignee: Shin-Etsu Chemical Co., Ltd., Tokyo, Japan

[21] Appl. No.: 779,166

[22] Filed: Oct. 21, 1991

Related U.S. Application Data

[63] Continuation of Ser. No. 373,192, Jun. 29, 1989, abandoned.

[30] Foreign Application Priority Data

Jul. 5, 1988 [JP] Japan .................. 63-167118

[51] Int. Cl.$^5$ .............................. C08L 83/10
[52] U.S. Cl. ............................ 525/479; 525/472; 525/476; 525/487; 525/502; 525/504
[58] Field of Search ............. 525/472, 479, 474, 476; 528/26, 38, 27, 28

[56] References Cited

U.S. PATENT DOCUMENTS

| | | | |
|---|---|---|---|
| 2,819,245 | 1/1958 | Shorr | 525/476 |
| 3,736,290 | 5/1973 | Fessler | 528/38 |
| 4,011,279 | 3/1977 | Berger et al. | 528/38 |
| 4,017,340 | 4/1977 | Yerman | 528/38 |
| 4,468,497 | 8/1984 | Street et al. | 525/422 |
| 4,755,569 | 7/1988 | Kanagawa et al. | 525/502 |
| 4,797,454 | 1/1989 | Ryang | 525/476 |
| 4,877,822 | 10/1989 | Itoh et al. | 523/433 |
| 4,885,329 | 12/1989 | Tominaga et al. | 524/430 |
| 4,908,417 | 3/1990 | Shiomi et al. | 525/422 |

*Primary Examiner*—Ralph H. Dean, Jr.
*Attorney, Agent, or Firm*—Birch, Stewart, Kolasch & Birch

[57] ABSTRACT

A curable polyimide resin is blended with (a) an organic silicon compound having a functional group selected from an epoxy group and an amino group or (b) a copolymer of an aromatic polymer and an organic silicon compound. The resulting polyimide resin composition can be cured without inducing a crack. It is suitable for the encapsulation of semiconductor devices as well as for molding and powder coating.

7 Claims, No Drawings

POLYIMIDE RESIN COMPOSITION AND SEMICONDUCTOR DEVICE ENCAPSULATED THEREWITH

This application is a continuation of application Ser. No. 07/373,192 filed on Jun. 29, 1989, now abandoned.

This invention relates to polyimide resin compositions for use as molding compositions and powder coating compositions as well as semiconductor encapsulating material. It also relates to a semiconductor devices encapsulated with such cured polyimide resin compositions.

BACKGROUND OF THE INVENTION

Polyimide resins and their compositions having inorganic fillers blended therein are widely used as molding material, powder coating material, electrical insulating material and the like because of their heat resistance, bond strength, electrical properties, mechanical properties, and humidity resistance. In recent years, they are of concern as encapsulating material for semiconductor chips.

However, prior art polyimide resin compositions tend to crack upon curing, forming molded and coated articles having a less desirable appearance. Particularly when they are used for the encapsulation of semiconductor devices. For example, most of them are likely to incur defects when used to encapsulate semiconductor elements or devices.

SUMMARY OF THE INVENTION

An object of the present invention is to provide a novel and improved polyimide resin composition which can be cured into a crack resistant article and is thus feasible for semiconductor encapsulation.

Another object of the present invention is to provide a semiconductor device encapsulated with a cured product of such a composition.

The inventors have found that when an additive selected from (a) an organic silicon compound having a functional group selected from an epoxy group and an amino group, and (b) a copolymer of an aromatic polymer and an organic silicon compound is blended with a curable polyimide resin, there is obtained a polyimide resin composition which can be cured into a product having improved crack resistance, high mechanical strength, low flexural modulus, and a high glass transition temperature. When a semiconductor chip is encapsulated with the composition in cured state, there is obtained a highly reliable semiconductor device.

The preferred additive is a copolymer obtained through addition reaction between an alkenyl group of an alkenyl group-containing epoxidized novolak resin and a

group of an organopolysiloxane represented by the general formula:

$$H_aR_bSiO_{[4-(a+b)]/2} \quad (1)$$

wherein R is a monovalent substituted or unsubstituted hydrocarbon group, letter a has a value of from 0.01 to 0.1, letter b has a value of from 1.8 to 2.2, and $1.81 \leq a+b \leq 2.3$, and having 20 to 400 silicon atoms and 1 to 5

groups per molecule.

Several epoxy resin compositions are known in the prior art. Japanese Patent Application Kokai No. 21417/1983 discloses an epoxy resin composition having blended therein a copolymer of an aromatic polymer and an organopolysiloxane. It is also proposed to use an alkenyl group-containing novolak epoxy resin as the aromatic polymer for such a composition as disclosed in Japanese Patent Application Kokai No. 84147/1987 or European Patent Application No. 218228. The copolymer of an alkenyl group-containing novolak epoxy resin and an organopolysiloxane could dramatically improve the crack resistance of epoxy resin because the copolymer contains the same or a similar epoxy resin segment as in the curable epoxy resin and thus has sufficient affinity to the epoxy resin to allow for microscopic dispersion as described in Japanese Patent Application Kokai No. 84147/1987 or European Patent Application No. 218228. Unexpectedly, this copolymer has been found to impart crack resistance to polyimide resins.

According to a first aspect of the present invention, there is provided a polyimide resin composition comprising
a curable polyimide resin, and
an additive selected from (a) an organic silicon compound having functional groups selected from an epoxy group and an amino group, and (b) a copolymer of an aromatic polymer and an organic silicon compound.

The present invention also provides a semiconductor device encapsulated with the polyimide resin composition in cured form.

DETAILED DESCRIPTION OF THE INVENTION

The curable polyimide resin which is a base of the present composition includes those polyimide resins having at least two imide bonds per molecule and at least two groups per molecule which are selected from alkenyl and amino groups and may be of the same or different types. Preferred are those polyimide resins having a melting point of up to 150° C. Most preferred are polymaleimide resins and their derivatives with amino group-containing compounds. Some non-limiting examples of the polyimide resin include N,N'-diphenylmethanebismaleimide, N,N'-phenylenebismaleimide, N,N'-diphenyletherbismaleimide, N,N'-ethylenebismaleimide, N,N'-xylylenebismaleimide, and compounds of the following formulas, alone and mixtures thereof.

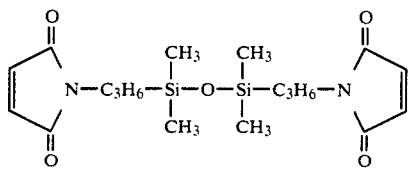

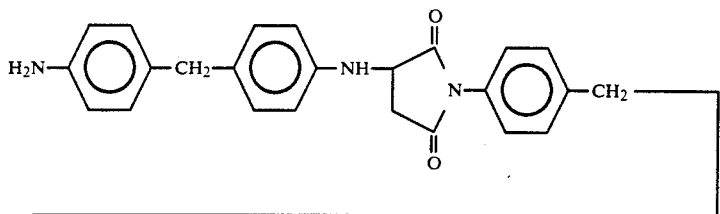

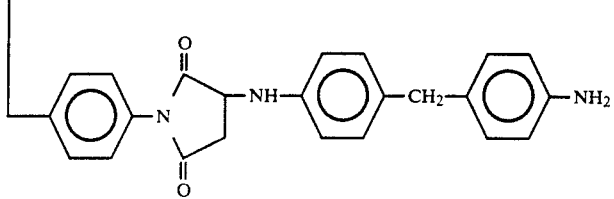

The polyimide resin composition of the invention is a blend of the above-mentioned polyimide resin with an additive selected from (a) an organic silicon compound having functional groups selected from an epoxy group and an amino group, and (b) a copolymer of an aromatic polymer and an organic silicon compound, which blend can be cured without incurring cracks.

The functional group-containing organic silicon compound (a) is preferably an organopolysiloxane represented by the general formula:

$$R^1_x R^2_y SiO_{[4-(x+y)]/2}$$

wherein $R^1$ is a monovalent hydrocarbon group, preferably having 1 to 8 carbon atoms, containing an amino or epoxy group, $R^2$ is a monovalent hydrocarbon group preferably having 1 to 8 carbon atoms, letters x and y are in the range: $0.002 \leq x \leq 0.2$, $1.9 \leq y \leq 2.1$, and $1.9 \leq x+y \leq 2.2$, and having at least one $R^1$ and 20 to 1,000 silicon atoms per molecule.

Preferred examples of $R^1$ group include

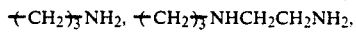

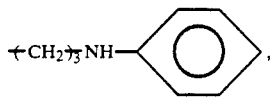

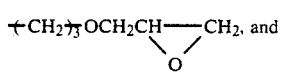

-continued

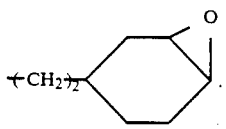

The groups represented by $R^2$ preferably have 1 to 8 carbon atoms and include an alkyl group having 1 to 8 carbon atoms such as methyl, ethyl, propyl, and butyl groups, an aryl group having 6 to 8 carbon atoms such as phenyl and tolyl groups, and substituted alkyl and aryl groups in which at least one hydrogen atom is substituted with a halogen atom, such as $ClCH_2-$, $CF_3C_2H_4-$, $ClC_3H_6-$, and

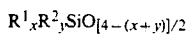

Preferred ranges of x and y are:
x=0.01 to 0.1
y=1.95 to 2.05
x+y=1.96 to 2.1.

Also preferably, the number of silicon atoms ranges from 20 to 400 and the number of R1 groups ranges from 2 to 10.

Preferred examples of the organopolysiloxane are shown below.

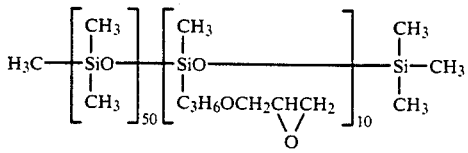

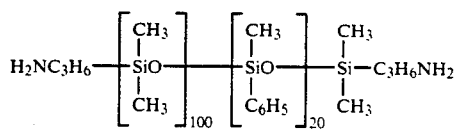
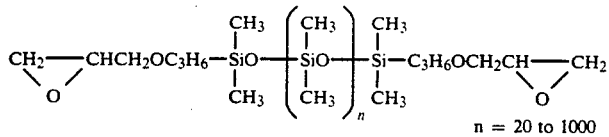
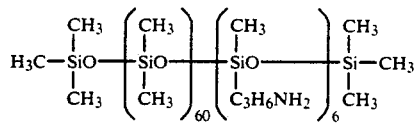
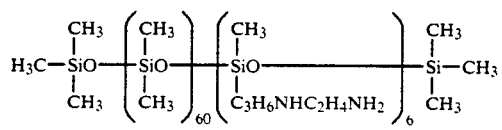
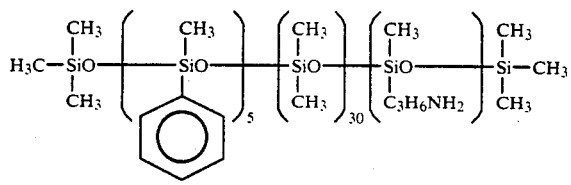
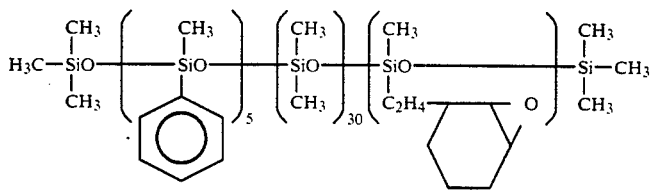
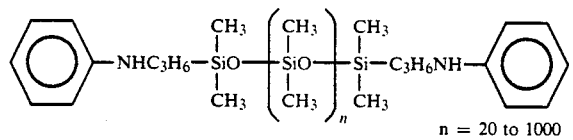
Copolymer (b) is a copolymer of an aromatic polymer and an organic silicon compound. Preferred examples of the aromatic polymer are shown below.
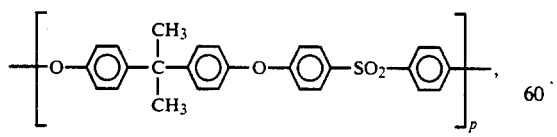
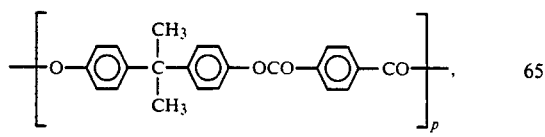
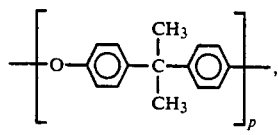
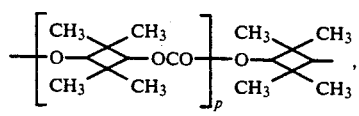
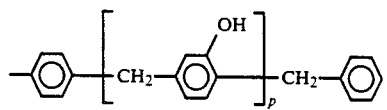

-continued

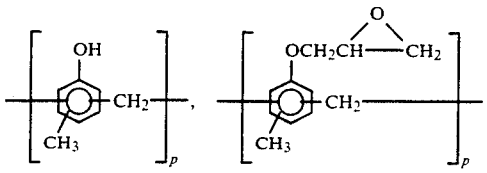

In the above formulae, p has a value of from 1 to 20.

Preferred examples of the aromatic polymer-organic silicon compound copolymer are shown below.

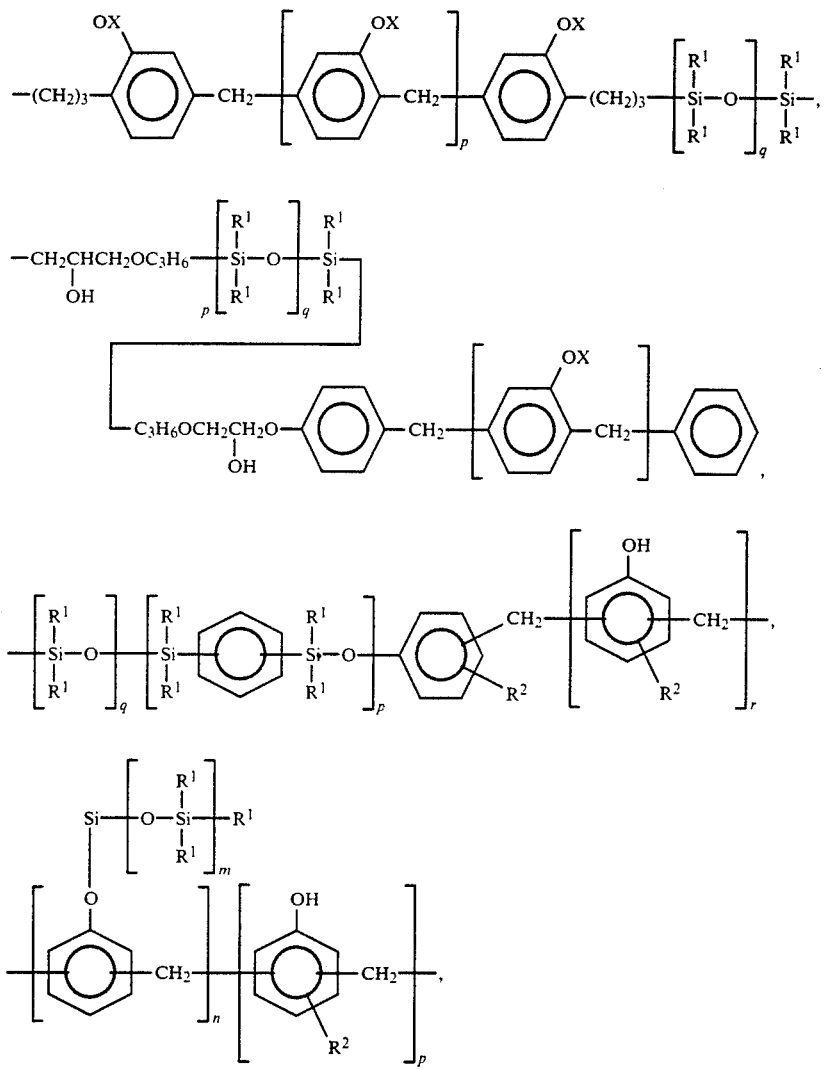

In the above formulae, p, q, r, m, and n are positive numbers, X is hydrogen or a glycidyl group, $R^1$ and $R^2$ are monovalent hydrocarbon groups.

Preferably in the above formulae, p has a value of from 1 to 20, q has a value of from 10 to 400, r has a value of from 1 to 20, m has a value of from 10 to 400, n has a value of from 1 to 3, $R^1$ is a methyl, ethyl, butyl, or phenyl group, and $R^2$ is hydrogen or a methyl, ethyl, or butyl group.

Preferably, copolymer (b) has at least one group capable of reacting with the polyimide resin or a curing agent therefor. More preferably the aromatic polymer component in copolymer (b) is a phenolic or epoxy resin because copolymer (b) itself can serves as part of the curing agent.

The above-mentioned additives (a) and (b) may be used alone or a mixture of additives (a) or additives (b) or additives (a) and (b).

Most often the additive is a copolymer obtained through addition reaction between an alkenyl group of an alkenyl group-containing epoxidized novolak resin and a

group of an organopolysiloxane represented by the general formula:

$$H_aR_bSiO_{[4-(a+b)]/2} \qquad (1)$$

wherein R is a monovalent substituted or unsubstituted hydrocarbon group, letter a has a value of from 0.01 to 0.1, letter b has a value of from 1.8 to 2.2, and $1.81 \leq a+b \leq 2.3$, and having 20 to 400 silicon atoms and 1 to 5

groups per molecule.

The monovalent substituted or unsubstituted hydrocarbon groups represented by R may preferably have 1 to 10 carbon atoms and include an alkyl group having 1 to 10 carbon atoms such as methyl, ethyl, propyl, and butyl groups, an aryl group having 6 to 10 carbon atoms such as phenyl and tolyl groups, an alkoxy group having 1 to 5 carbon atoms such as methoxy and ethoxy groups,

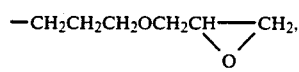

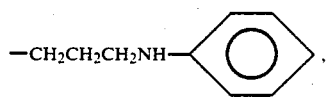

and substituted alkyl and aryl groups in which at least one hydrogen atom is substituted with a halogen atom, such as ClCH$_2$—, CF$_3$C$_2$H$_4$—, ClC$_3$H$_6$—, and

and mixtures thereof. The amount of alkoxy group introduced in R may preferably range from 0 to 10 mol %. Most preferred are methyl, phenyl and 2-trimethoxysilylethyl groups and mixtures thereof.

Preferred ranges of a and b are:

|   | Preferred | More preferred |
|---|-----------|----------------|
| a | 0.01–0.08 | 0.01–0.07 |
| b | 1.9–2.2 | 2.0–2.1 |
| a + b | 1.91–2.3 | 2.01–2.05 |

Also preferably, the number of silicon atoms ranges from 20 to 300, more preferably from 30 to 200 and the number of

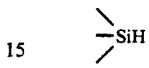

groups is 2 or 3.

This preferred copolymer will be described in more detail. The alkenyl group-containing epoxidized novolak resin which is one component of the copolymer may be prepared by epoxidizing an alkenyl group-containing phenolic resin with epichlorohydrin or partially reacting a conventional well-known epoxy resin with 2-allylphenol or allyl alcohol, for example. Illustrative examples of the alkenyl group-containing epoxidized novolak resin are those of formulae (2) to (4) shown below.

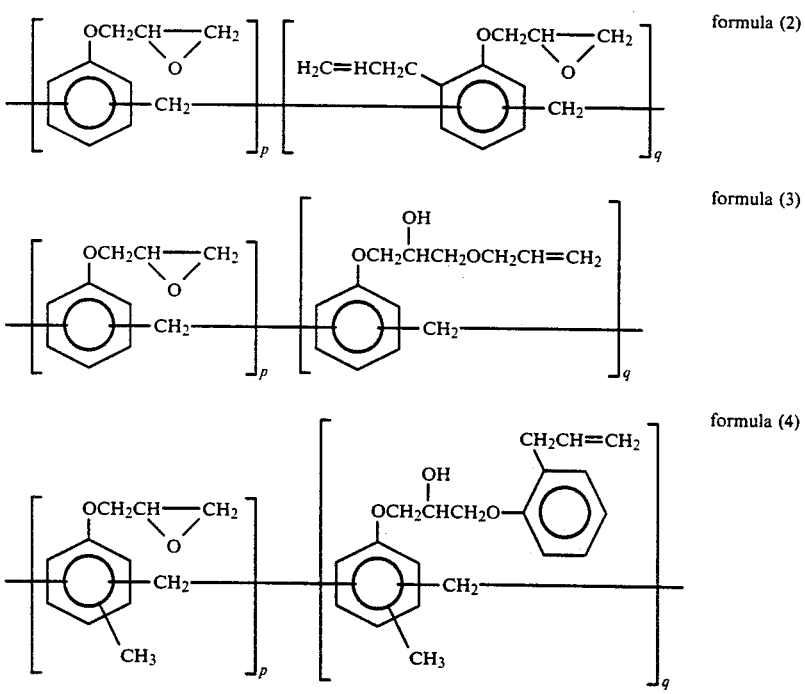

In formulae (2) to (4), p and q are positive numbers in the range: 1≦p≦10 and 1≦q≦3.

The organopolysiloxane of formula (1) which is the other component of the copolymer has 20 to 400 silicon atoms per molecule and 1 to 5

groups per molecule as described above. Preferred are both hydrogen terminated dimethylpolysiloxane, both hydrogen terminated methylphenylpolysiloxane, and both hydrogen terminated methyl-(2-trimethoxysilylethyl)polysiloxane. Illustrative examples of the organopolysiloxane are those of formulae (5) to (9) shown below.

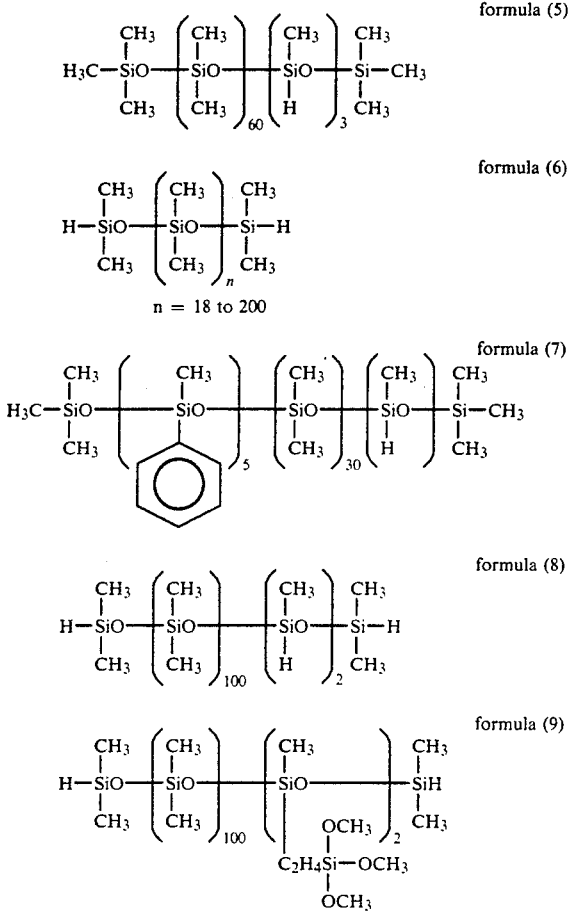

It is recommended to introduce a group such as

—C₂H₄Si(OCH₃)₃, —CH₂—CH₂COOCH₂Si(OCH₃)₃,

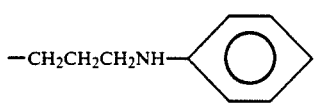

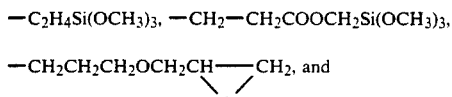

into organopolysiloxanes as their side chain, as exemplified by formula (9), for dispersion and adherence.

The organopolysiloxane of formula (1) generally has a degree of polymerization, that is the number of silicon atoms per molecule (n), of 20 to 400, preferably 20 to 300, more preferably 30 to 200. The degree of polymerization is described in detail, but not by way of limitation. If degree of polymerization n is less than 20, it is rather difficult to impart adequate flexibility and a high glass transition temperature (Tg). If n is over 400, preparation of copolymers becomes technically very difficult. Even if such copolymers are obtained, they cannot be readily dispersed, almost failing to attain the purposes of the invention. In general, as n increases, organopolysiloxanes show better results with respect to the cracking resistance and glass transition temperature for the same silicon content, but tend to lower in dispersibility and adherence to elements. It will be understood that introduction of the above-mentioned functional groups compensates for a lowering of dispersibility and adherence.

The copolymer may be prepared by heating an alkenyl group-containing epoxidized novolak resin and an organopolysiloxane of formula (1) in the presence of a conventional well-known addition catalyst, for example, a platinum catalyst such as chloroplatinic acid, thereby reacting an alkenyl group of the former with a

group of the latter. It is preferred that the copolymer have a solubility parameter of from 7.3 to 8.5, especially from 7.6 to 8.2. A copolymer having such a solubility parameter may be prepared by reacting an organopolysiloxane and an alkenyl group-containing epoxy resin such that 0.7 < A/B < 7, especially 1 < A/B < 5 wherein A is the equivalent of

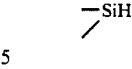

of the organopolysiloxane and B is the molecular weight of the epoxy resin. The solubility parameter SP used herein is defined by the following equation:

$$(SP)^2 = \Delta E/V \text{ (cal/cc)}$$

wherein $\Delta E$ is an evaporation energy (cal/mol) and V is a molar volume (cc/mol).

In the preferred embodiment of the invention, the additive (a) or (b) is blended with the curable polyimide resin such that 1 to 80 parts by weight, especially 2 to 50 parts by weight of additive (a) or (b) is present per 100 parts by weight of the polyimide resin.

The polyimide resin composition of the invention may further contain a curing agent. The curing agent may be selected from conventional well-known curing agents including amines such as dicyandiamide, 4,4'-diaminodiphenylmethane, and m-phenylenediamine, and phenols such as cresol novolak resins, and phenol novolak resins. The curing agent may be blended in commonly used amounts, more illustratively in amounts of 0 to 100 parts, preferably 0 to 30 parts by weight per 100 parts by weight of the polyimide resin. The addition of an extra curing agent may be omitted when the additive blended in the composition is copolymer (b) wherein the aromatic polymer component is a phenol or epoxy resin. This is because the copolymer (b) itself has a curing function as previously described.

The polyimide resin composition of the invention may further contain a curing promoter if desired. The curing promoter may be selected from conventional well-known agents including peroxides such as benzoyl peroxide and basic compounds such as 2-methylimidazole, 1,8-diazabicycloundecene-7, and triphenylphosphine and added in commonly used amounts. The curing promoter may be added in amounts of 0 to 30 parts, preferably 1 to 5 parts by weight per 100 parts by weight of the polyimide resin.

Also preferably, an inorganic filler may be blended in the polyimide resin composition of the invention. A proper type of inorganic filler may be chosen depending on a particular application of the composition. For example, a choice may be made of naturally occurring silica species such as crystalline silica and amorphous silica, synthetic high purity silica, synthetic spherical silica, talc, mica, silicon nitride, boron nitride, and alumina, and mixtures thereof.

The inorganic filler is preferably blended in amounts of about 100 to about 1,000 parts by weight, more preferably about 200 to about 600 parts by weight per 100 parts by weight of the composition, that is, the total of the polyimide resin, additive (a) or (b), and curing agent if any. Less amounts of the inorganic filler will be less effective for its purpose of increasing the strength of the composition. Sometimes physical properties such as crack resistance become less desirable. Larger amounts of the inorganic filler beyond the range would adversely affect the flow of the composition and are difficult to disperse.

The polyimide resin composition of the invention may further contain any other additives if desired, depending on a particular end or application of the composition. These optional additives include mold release agents such as wax and fatty acids such as stearic acid and fatty acid metal salts, pigments such as carbon black, dyes, anti-oxidants, flame retardants, surface treating agents such as γ-glycidoxypropyltrimethoxysilane, and the like.

The polyimide resin composition of the present invention may be prepared by a conventional method as by mixing predetermined amounts of the above-mentioned components, milling the mixture in suitable milling means preheated at about 70° to 95° C., for example, a kneader, roll mill or extruder, and cooling the mixture, followed by comminuting. The order of blending the necessary components is not critical.

The polyimide resin composition of the present invention is advantageously used as a molding composition and a powder coating composition. It is also feasible for the encapsulation of semiconductor devices such as IC, LSI, transistors, thyristors, and diodes and the manufacture of printed circuit boards. When it is used to encapsulate semiconductor devices, a commonly used molding technique for such purpose may be used, including transfer molding, injection molding and casting. The polyimide resin composition of the invention favors molding at a temperature in the range of about 150° to about 220° C. and post curing at a temperature in the range of about 150° to about 220° C. for about 2 to about 16 hours.

The polyimide resin composition of the invention can be cured into a molded article having improved crack resistance, high mechanical strength, low flexural modulus, and a high glass transition temperature. The composition is useful as molding material and powder coating material and especially advantageous as semiconductor encapsulating material. A semiconductor device encapsulated with the composition in cured form has high reliability.

EXAMPLE

Examples of the present invention are given below together with comparative examples by way of illustration and not by way of limitation. All parts and percents are by weight unless otherwise stated.

First, preparation of curable polyimide resins and additive copolymers is described.

Synthesis of Curable Polyimide Resin

A 2-liter four-necked flask was charged with 198 grams of 4,4'-diaminodiphenylmethane and 200 grams of N-methyl-2-pyrolidone. The contents were stirred for one hour while the flask was heated at 120° C. To the resulting solution, 860 grams of a solution of 50% N,N'-4,4'-diphenylmethanebismaleimide in N-methyl-2-pyrolidone was added dropwise over 30 minutes. Reaction was continued for a further 20 minutes. The reaction solution was added dropwise to water with stirring, causing the polyimide resin to precipitate. The precipitate was removed by filtration, washed with water, and vacuum dried, obtaining a curable polyimide resin designated Polyimide Resin II in a yield of 530 grams. This resin showed the following properties.

Appearance: brown solid
Melt viscosity: 5.6 poise @150° C.
Heating loss: 0.42% @150° C./hour Polyimide resin II synthesized above and Polyimide resin I later used in Example have the following structural formulae.

Polyimide resin I

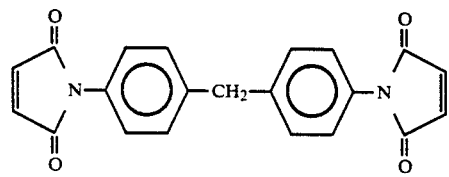

Polyimide resin II

-continued

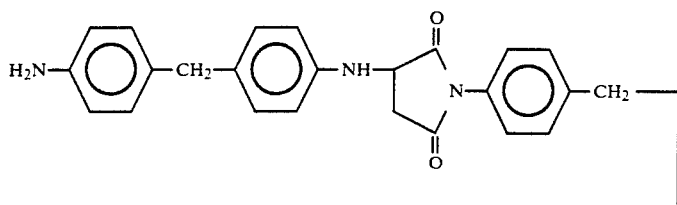

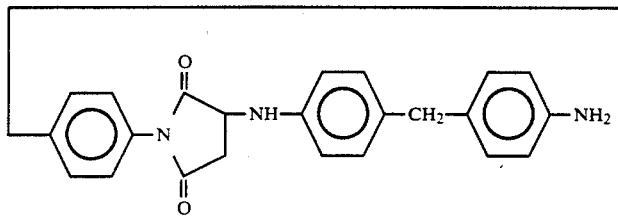

Preparation of Copolymer

A 1-liter four-necked flask equipped with a reflux condenser, thermometer, stirrer, and drop funnel was charged with 300 grams of an epoxidized phenol novolak resin having a softening point of 80° C. and an epoxy equivalent of 195. While the contents were stirred at a temperature of 110° C., a mixture of 32 grams of 2-allylphenol and 1 gram of tributylamine was added dropwise to the flask over 10 minutes. Stirring was continued for an additional 2 hours at a temperature of 110° C. The reaction product was vacuum stripped of the unreacted 2-allylphenol and tributylamine, yielding an allyl group-containing epoxy resin having an allyl equivalent of 1490 and an epoxy equivalent of 235.

A four-necked flask as used above was charged with 120 grams of the allyl group-containing epoxy resin prepared above, 100 grams of methyl isobutyl ketone, 200 grams of toluene, and 0.04 grams of a 2-ethylhexanol modified chloroplatinic acid solution having a platinum concentration of 2%. The mixture was azeotroped for 1 hour for water removal. Then 80 grams of each of the organopolysiloxanes shown in Table 1 was added dropwise over 30 minutes at the reflux temperature. Reaction was continued at the same temperature for a further 4 hours with stirring. The reaction mixture was washed with water and vacuum stripped of the solvent, yielding the reaction product. In this way there were obtained Copolymers I, II, and III as shown in Table 1.

TABLE 1

|  | Copolymer | | |
|---|---|---|---|
|  | I | II | III |
| Starting organo-polysiloxane* | A | B | C |
| Appearance | pale yellow clear solid | whitish yellow opaque solid | whitish yellow opaque solid |
| Melt viscosity, cp @ 150° C. | 650 | 760 | 890 |
| Heating loss, | 0.42 | 0.56 | 0.45 |

TABLE 1-continued

|  | Copolymer | | |
|---|---|---|---|
|  | I | II | III |
| % @ 150° C., 1 hr | | | |

Note:
Organopolysiloxanes A, B and C are of the following formulae.
Organopolysiloxane A:

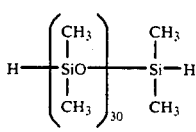

Organopolysiloxane B:

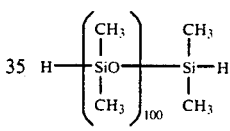

Organopolysiloxane C:

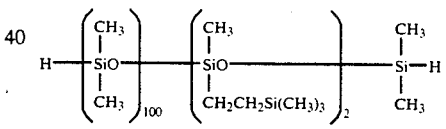

EXAMPLES 1-8

A polyimide resin was blended with a copolymer along with 4,4'-diaminodiphenylmethane as shown in Table 2. The polyimide resins used were N,N'-diphenylmethanebismaleimide designated Polyimide Resin I and Polyimide Resin II synthesized above. The copolymers used were Copolymers I, II, and III synthesized above.

Polyimide resin compositions were prepared by adding 260 parts of powder quartz, 1.5 parts of 3-glycidoxypropyltrimethoxysilane, 1.5 parts of wax E, 2.0 parts of triphenylphosphine, and 1.0 part of carbon black to 100 parts of each of the blends. The resulting blends were melt milled between a pair of hot mill rolls until they became homogeneous.

The polyimide resin compositions were examined by the following tests.

A) Spiral flow test

Spiral flow was measured at 175° C. and 70 kg/cm² using a mold according to the EMMI standard.

B) Mechanical strength (Flexural strength and modulus)

Test bars of 10×100×4 mm (thick) were molded at 175° C. under 70 kg/cm² for 5 minutes and post cured at 200° C. for 4 hours. Flexural strength and modulus were measured according to JIS K-6911.

C) Expansion coefficient and Glass transition temperature

A dilatometer was used to measure a test rod of 4 mm diameter by 15 mm for expansion coefficient and glass transition temperature (Tg) by heating at a rate of 5° C. per minute.

D) Crack resistance

A silicon chip of 9.0×4.5×0.5 mm was bonded to a 14-pin IC frame (42 alloy). The assembly was encapsulated with a polyimide resin composition by molding the composition around the assembly at 175° C. for 5 minutes and post curing at 200° C. for 4 hours. The encapsulated article was subjected to thermal cycling between −195° C./1 min. and 260° C./30 sec. It was observed for occurrence of cracks in the resin at the end of 20 cycles. The crack resistance is a percent occurrence of cracked samples per 50 samples.

The results are shown in Table 2.

through an addition reaction between an alkenyl group of an alkenyl group-containing epoxidized novolak resin and a

group of an organopolysiloxane represented by the general formula:

$$H_aR_bSiO_{[4-(a+b)]/2} \quad (1)$$

wherein R is a monovalent group selected from $C_{1-10}$ alkyl, $C_{6-10}$ aryl, $C_{1-15}$ alkoxy, halogen substituted $C_{1-10}$ alkyl, halogen substituted $C_{6-10}$ aryl, 2-trisubstituted $C_{1-10}$ alkyl, halogen substituted $C_{6-10}$ aryl, 2-trimethoxysilylethyl, trimethoxysilylmethyl, 3-propionic acid ester, epoxymethoxypropyl or phenylaminopropyl, the

TABLE 2

|  | 1 | 2 | 3 | 4 | 5 | 6* | 7* | 8* |
|---|---|---|---|---|---|---|---|---|
| Composition |  |  |  |  |  |  |  |  |
| Polyimide resin I | 84 | 75 | 75 | 75 | — | — | 100 | 90 |
| Polyimide resin II | — | — | — | — | 84 | 100 | — | — |
| 4,4′-diaminodiphenylmethane | — | 9 | 9 | 9 | — | — | — | 10 |
| Copolymer I | 16 | 16 | — | — | 16 | — | — | — |
| Copolymer II | — | — | 16 | — | — | — | — | — |
| Copolymer III | — | — | — | 16 | — | — | — | — |
| Properties |  |  |  |  |  |  |  |  |
| Spiral flow | 27 | 25 | 24 | 24 | 24 | 22 | 28 | 23 |
| Flexural strength, kg/mm$^2$ | 13.8 | 14.0 | 14.2 | 13.6 | 13.1 | 13.7 | 10.9 | 12.7 |
| Flexural modulus, kg/mm$^2$ | 1410 | 1440 | 1450 | 1470 | 1430 | 1700 | 1650 | 1720 |
| Expansion coefficient, $10^{-5}$/°C. | 1.7 | 1.6 | 1.7 | 1.7 | 1.6 | 1.7 | 1.8 | 1.7 |
| Tg, °C. | 245 | 252 | 247 | 250 | 251 | 230 | 210 | 233 |
| Crack resistance, % | 0 | 0 | 0 | 0 | 0 | 100 | 100 | 100 |

*outside the scope of the invention

As is evident from Table 2, the polyimide resin compositions having blended the copolymers within the scope of the present invention cure into products having improved crack resistance while maintaining good flexural strength, expansion coefficient, low flexural modulus, and a high glass transition temperature.

Several preferred embodiments have been described. Obviously many modifications and variations of the present invention are possible in the light of the above teachings. It is therefore to be understood that within the scope of the appended claims, the invention may be practiced otherwise than as specifically described.

What is claimed is:

1. A polyimide resin composition comprising a curable polymaleimide resin and a copolymer obtained letter a has a value of from 0.01 to 0.1, the letter b has a value of from 1.8 to 2.2, and $1.81 \leq a+b \leq 2.3$, and having 20 to 400 silicon atoms and 1 to 5

groups per molecule.

2. A polyimide resin composition as set forth in claim 1, wherein the curable polymaleimide resin is selected from the group consisting of N,N′-diphenylmethanebismaleimide, N,N′-phenylenebismaleimide, N,N′-xylylenebismaleimide,

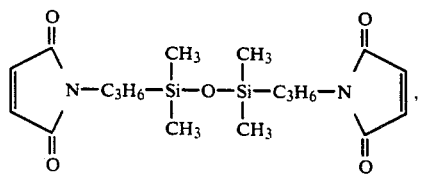

-continued

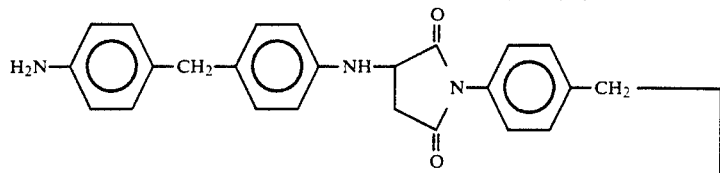

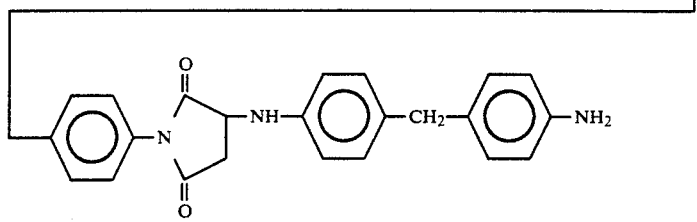

and mixtures thereof.

3. A polyimide resin composition as set forth in claim 1 wherein the copolymer is present in a crack preventing amount.

4. A polyimide resin composition as set forth in claim 1 wherein 1 to 80 parts by weight of the copolymer is present per 100 parts by weight of the polyimide resin.

5. A polyimide resin composition as set forth in claim 1 wherein the organopolysiloxane is a linear diorganopolysiloxane of formula (1) wherein R is selected from the group consisting of methyl, phenyl, and 2-trimethoxysilylethyl groups and mixtures thereof, the molecular chain ends of said diorganopolysiloxane being both capped with dimethylsiloxy groups

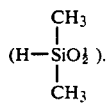

6. A polyimide resin composition as set forth in claim 1 wherein the polymaleimide resin contains an amino group.

7. A semiconductor device encapsulated with a cured product of a polyimide resin composition as set forth in claim 1, 2, 3, 4, 5 or 6.

* * * * *